(12) United States Patent
Xhafa et al.

(10) Patent No.: US 12,381,408 B2
(45) Date of Patent: Aug. 5, 2025

(54) OPERATING MODES FOR TESTING MONITOR CIRCUITS

(71) Applicant: Texas Instruments Incorporated, Dallas, TX (US)

(72) Inventors: Ariton E. Xhafa, Plano, TX (US); Mathew Giaramita, New York, NY (US); Minghua Fu, Plano, TX (US); Arvind Kandhalu, Frisco, TX (US); Jonathan Nafziger, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 871 days.

(21) Appl. No.: 17/576,001

(22) Filed: Jan. 14, 2022

(65) Prior Publication Data

US 2022/0231525 A1 Jul. 21, 2022

Related U.S. Application Data

(60) Provisional application No. 63/138,266, filed on Jan. 15, 2021.

(51) Int. Cl.
*H01M 10/44* (2006.01)
*G01R 31/382* (2019.01)
*H01M 10/46* (2006.01)
*H02J 7/00* (2006.01)

(52) U.S. Cl.
CPC .......... *H02J 7/0047* (2013.01); *G01R 31/382* (2019.01)

(58) Field of Classification Search
CPC .... H02J 7/0047; H02J 2310/48; G01R 31/382

USPC ................................ 320/107, 116, 132, 149
See application file for complete search history.

(56) References Cited

U.S. PATENT DOCUMENTS

2021/0027854 A1* 1/2021 Lin .................. G11C 29/02
2022/0332213 A1* 10/2022 Xhafa .................. B60L 58/10

OTHER PUBLICATIONS

Texas Instruments Incorporated, BQ79616-Q1 Datasheet, "Functional Safety-Compliant Automotive 16S/14S/12S Battery Monitor, Balancer and Integrated Hardware Protector," 13 pages, Sep. 2019—Revised Jun. 2021.
Texas Instruments Incorporated, CC2662R-Q1 Datasheet, "SimpleLink Wireless BMS MCU," 46 pages, Dec. 2020.
Xhafa, et al., Texas Instruments Incorporated, "Wireless Protocol for Battery Management," U.S. Appl. No. 17/233,106, filed Apr. 16, 2021.

(Continued)

*Primary Examiner* — Edward Tso
(74) *Attorney, Agent, or Firm* — Carl G. Peterson; Frank D. Cimino

(57) ABSTRACT

A system is provided. In some examples, the system includes a control circuit and a plurality of monitor circuits including a first monitor circuit. In a production mode, the control circuit is configured to test the plurality of monitor circuits. In a storage mode after testing the plurality of monitor circuits in the production mode, the control circuit is configured to test the plurality of monitor circuits more than once. In an assembly mode after testing the plurality of monitor circuits in the storage mode, the control circuit is configured to test the plurality of monitor circuits. In one or more examples, the control circuit is configured to skip the storage mode and test the plurality of monitor circuits in the assembly mode after testing in the production mode.

20 Claims, 6 Drawing Sheets

(56) References Cited

OTHER PUBLICATIONS

Burnight, et al., Texas Instruments Incorporated, "Key Refreshment with Session Count for Wireless Management of Modular Subsystems," U.S. Appl. No. 17/314,865, filed May 7, 2021.
Burnight, et al., Texas Instruments Incorporated, "Wireless Battery Management System Setup," U.S. Appl. No. 17/399,793, filed Aug. 11, 2021.
Coelho, et al., Texas Instruemnts Incorporated, "Data Integrity Options for Wireless Management of Modular Subsystems," U.S. Appl. No. 17/491,218, filed Sep. 30, 2021.

\* cited by examiner

OPERATING MODES FOR TESTING MONITOR CIRCUITS

CROSS-REFERENCE TO RELATED APPLICATIONS

This application claims the benefit of U.S. Provisional Patent Application No. 63/138,266, filed Jan. 15, 2021, the entire content being incorporated herein by reference.

BACKGROUND

A battery management system may manage rechargeable batteries by monitor cell-voltage, temperature, and/or other factors for the safe and efficient operation of the battery, such as a battery or batteries of electric vehicles. Some battery management systems may communicate via wired communication where a main controller is coupled to a battery module which is coupled to other battery modules in a daisy chain.

SUMMARY

In some examples, a system includes a control circuit and a plurality of monitor circuits including a first monitor circuit. In a production mode, the control circuit is configured to test the plurality of monitor circuits. In a storage mode after testing the plurality of monitor circuits in the production mode, the control circuit is configured to test the plurality of monitor circuits more than once. In an assembly mode after testing the plurality of monitor circuits in the storage mode, the control circuit is configured to test the plurality of monitor circuits. In one or more of these examples, the control circuit is configured to skip the storage mode and test the plurality of monitor circuits in the assembly mode after testing in the production mode.

In further examples, a method includes testing, by a control circuit operating in a production mode, the plurality of monitor circuits. The method also includes testing, by the control circuit operating in a storage mode, the plurality of monitor circuits more than once after testing the plurality of monitor circuits in the production mode. The method further includes testing, by the control circuit operating in an assembly mode, the plurality of monitor circuits after testing the plurality of monitor circuits in the storage mode. In one or more of these examples, the control circuit tests the plurality of monitor circuits in the assembly mode after testing in the production mode by skipping the storage mode.

In yet further examples, a non-transitory computer-readable medium has executable instructions stored thereon, configured to be executable by processing circuitry for causing the processing circuitry to test, in a production mode, the plurality of monitor circuits. In addition, the instructions are configured to be executable by the processing resource for further causing the processing resource to test, in a storage mode, the plurality of monitor circuits more than once after testing the plurality of monitor circuits in the production mode. The instructions are configured to be executable by the processing resource for further causing the processing resource to test, in an assembly mode, the plurality of monitor circuits after testing the plurality of monitor circuits in the storage mode. In one or more examples, the control circuit tests the plurality of monitor circuits in the assembly mode after testing in the production mode by skipping the storage mode. In one or more of these examples, the instructions are configured to be executable by the processing resource for causing the processing resource to test the plurality of monitor circuits in the assembly mode after testing in the production mode by skipping the storage mode.

BRIEF DESCRIPTION OF THE DRAWINGS

Features of the present invention may be understood from the following detailed description and the accompanying drawings. In that regard.

DETAILED DESCRIPTION

Specific examples are described below in detail with reference to the accompanying figures. It is understood that these examples are not intended to be limiting, and unless otherwise noted, no feature is required for any particular example. Moreover, the formation of a first feature over or on a second feature in the description that follows may include examples in which the first and second features are formed in direct contact and examples in which additional features are formed between the first and second features, such that the first and second features are not in direct contact.

Before installation into vehicle, a battery system may be tested to ensure that every battery cell and every monitor circuit is functioning properly. Each monitor circuit may be tested by a control circuit after the circuits come off the production line. In addition, each monitor circuit may be tested while in storage and just before assembly into the vehicle. This disclosure describes a control circuit that can form networks, communicate with monitor circuits, and perform tests in operational modes that are tailored to the production environment, the storage environment, and the assembly environment. Of course, this description and these advantages are merely examples, and no advantage is required for any particular embodiment.

Figure 1:
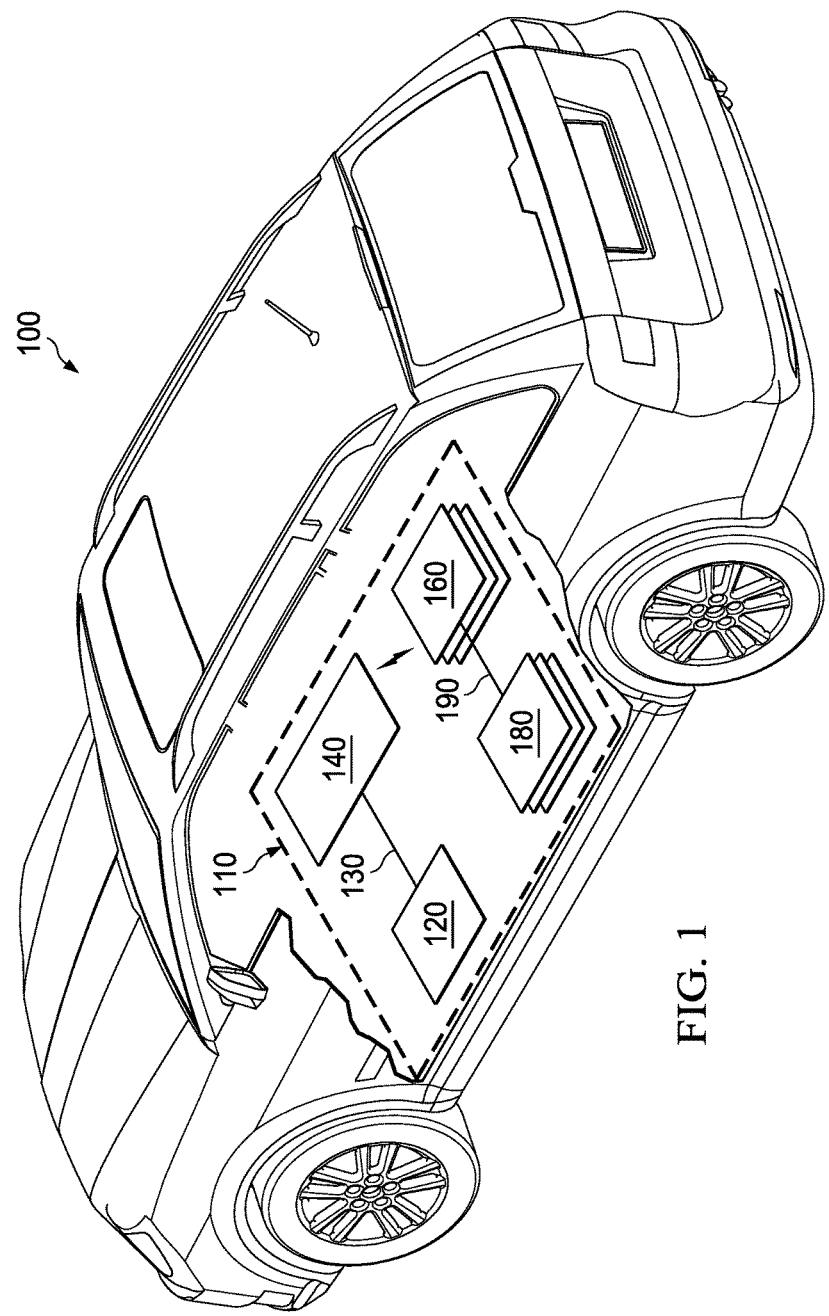
FIG. 1 is a conceptual block diagram of a monitor system mounted on a vehicle according to some aspects of the present disclosure.

Examples of communication with monitor circuits are described with reference to the figures below. In that regard, FIG. 1 is a conceptual block diagram of a monitor system 110 mounted on a vehicle 100 according to some aspects of the present disclosure. In some examples, monitor system 110 may include a wireless battery management system to supply power to one or more components of vehicle 100. As shown, monitor system 110 includes controller 120, primary network node 140, a plurality of secondary network nodes 160, and a plurality of monitored components 180. Monitor system 110 may include a plurality of primary network nodes.

FIG. 1 depicts monitor system 110 installed onboard an automobile (e.g., vehicle 100). FIG. 1 shows that monitor system 110 is installed in the underbelly of vehicle 100, but monitor system 110 may be positioned in other portions of vehicle 100 in some examples. Although FIG. 1 depicts vehicle 100 as an automobile, other monitor system may be configured for installation in other vehicles such as marine vehicles, aircraft, and other land vehicles and other environments such as industrial applications, and energy storage and distribution (e.g., for solar farms, wind turbines, or buildings).

In some examples, primary network node 140 is coupled to controller 120 using first wired connection 130. Primary network node 140 and/or controller 120 may be referred to herein as a main node or a master node configured to communicate with one or more end nodes. First wired connection 130 between primary network node 140 and controller 120 may include a universal asynchronous receiver/transmitter (UART) connection, a serial peripheral interface (SPI) connection, an inter-integrated circuit (I2C) connection, or the like. In some examples, controller 120, wired connection 130, and primary network node 140 may be integrated into a single device that includes the functionality attributed herein to components 120, 130, and 140.

Secondary network nodes 160 are wirelessly coupled to primary network node 140 and coupled to monitored components 180 using second wired connection 190. Secondary network nodes 160 may be referred to herein as end nodes, where some or all of the end nodes are configured to communicate with a single main node. In some examples, secondary network node 160, monitored component 180, and wired connection 190 may be integrated into a single device that includes the functionality attributed herein to components 160, 180, and 190.

In some examples, monitor system 110 provides wireless radio frequency (RF) communication between primary network node 140 and secondary network nodes 160. The wireless RF communication may use the license-free 2.4 gigahertz (GHz) industrial, scientific, and medical (ISM) band from 2.4 GHz to 2.483 GHz, which is compliant with BLUETOOTH special interest group. Monitor system 110 may use two megabits per second BLUETOOTH low energy across the physical layer (PHY) or any other protocol at any data rate across the PHY. The Open Systems Interconnection model includes the PHY as a layer used for communicating raw bits over a physical medium. In this case, the PHY is free space, which monitor system 110 uses to wirelessly communicate between primary network node 140 and secondary network nodes 160. In some examples, the transmission power of monitor system 110 is less than or equal to ten decibel-milliwatts. Although this disclosure describes wireless communication between a main node and one or more end nodes, the techniques of this disclosure may also be implemented in a system including wired communication between the main node and the end nodes.

FIG. 1 depicts components 120, 140, 160, and 180 assembled and installed in vehicle 100, but primary network node 140 may be able to communicate with secondary network nodes 160 before these components are installed in vehicle 100. For example, nodes 140 and 160 may be configured to operate in a production mode, a storage mode, and an assembly mode before being installed into vehicle 100. After components 120, 140, 160, and 180 are manufactured, controller 120 will be coupled to primary network node 140, and each of secondary network nodes 160 will be coupled to a respective one of monitored components 180. Then components 120, 140, 160, and 180 will be placed into storage before being transported to another facility for installation in vehicle 100.

It may be desirable to test components 120, 130, 140, 160, 180, and 190 during and after production, before placing components 120, 130, 140, 160, 180, and 190 into storage, while in storage, and while transporting components 120, 130, 140, 160, 180, and 190 to another facility. In addition, it may be desirable for nodes 140 and 160 to be capable of operating in a distinct mode (e.g., a production mode) for each round of testing, depending on the testing environment. For example, as controller 120 and primary network node 140 test components 130, 160, 180, and 190, additional components may join the network during the testing (e.g., as these components come off the production line), and some of components 130, 160, 180, and 190 may leave the network (e.g., after successful testing). The number of nodes, how often the nodes are communicating, and the testing protocol may vary across environments. Therefore, it may be desirable for controller 120 and nodes 140 and 160 to be capable of operating in distinct modes for the storage, transport, and assembly environments.

Figure 2:
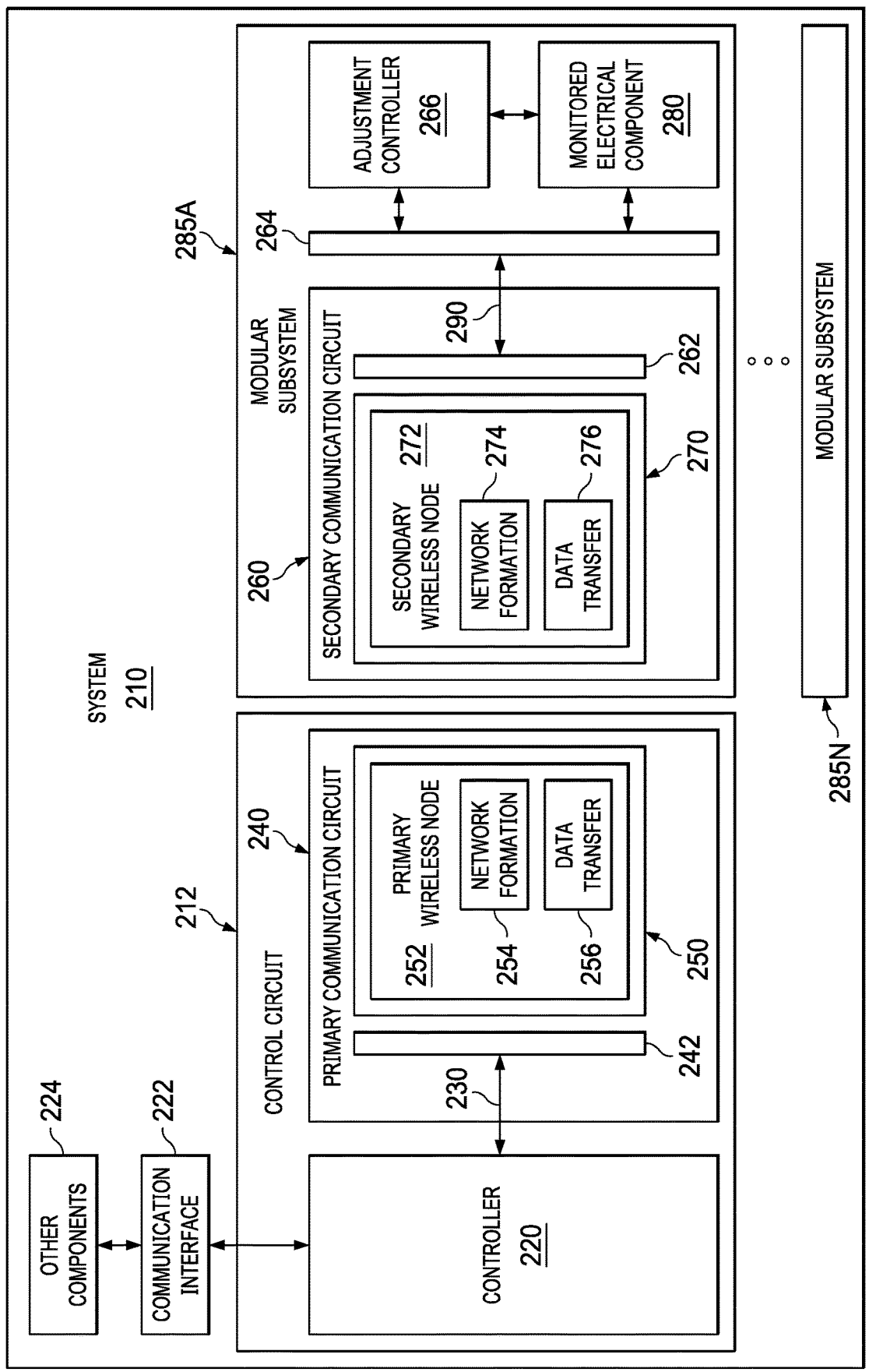
FIGS. 2 and 3 are conceptual block diagrams of a control circuit wirelessly coupled to a plurality of modular subsystems according to some aspects of the present disclosure.

FIG. 2 is a conceptual block diagram of a control circuit 212 wirelessly coupled to a plurality of modular subsystems 285A-285N according to some aspects of the present disclosure. System 210 include control circuit 212, communication interface 222, other components 224, and modular subsystems 285A-285N. In the example shown in FIG. 2, control circuit 212 includes controller 220 and primary communication circuit 240, and each of modular subsystems 285A-285N includes a respective secondary communication network circuit 260, processing circuit 264, adjustment controller 266, and monitored electrical component 280.

In some examples, system 210 is an electric vehicle or other application with battery management subsystems, or another system with modular subsystems. System 210 includes controller 220 in communication with modular subsystems 285A-285N via wireless communication channels. To support such communications between controller 220 (an example of controller 120 shown in FIG. 1) and modular subsystems 285A-285N, controller 220 is coupled via wired coupling 230 to primary communication circuit 240, where wired coupling 230 is an example of wired connection 130 shown in FIG. 1. Controller 220 is also coupled to other components 224 of system 210 via communication interface 222. In some examples, communication interface 222 is a controller area network (CAN) or other communication interface.

In the example of FIG. 2, each of modular subsystems 285A-285N includes a respective secondary communication circuit 260 (an example of one of secondary network nodes 160 shown in FIG. 1) in communication with primary communication circuit 240 (an example of one of primary network nodes 140 shown in FIG. 1) via respective wireless communication channels. As shown for modular subsystem 285A, secondary communication circuit 260 is coupled to a respective processing circuit 264 via wired coupling 290 (an example of wired connection 190 shown in FIG. 1). Thus, controller 220 is able to communicate with each respective processing circuit 264 of modular subsystems 285A-285N and vice versa via a combination of wired and wireless communications. Such communications may be for battery management system (BMS) operations or management of another type of monitored electrical component 280.

Adding wireless communications to system 210 using primary communication circuit 240 and each secondary communication circuit 260 facilitates wiring, repair, and/or replacement of some or all of the components of modular subsystems 285A-285N. However, such wireless communications may introduce data integrity vulnerabilities to system 210. Primary communication circuit 240 may be configured to perform data hashing, hash verification, encryption, and/or other operations to improve the integrity of data transferred via primary communication circuit 240. Additional example details of hashing and encryption can be found in commonly assigned U.S. patent application Ser. No. 17/491,218, entitled "Data Integrity Options for Wireless Management of Modular Subsystems," filed on Sep. 30, 2021, each of which is incorporated by reference in its entirety.

In operation, each of modular subsystems 285A-285N uses its respective processing circuit 264 to monitor parameters of monitored electrical component 280 (an example of one of monitored components 180 shown in FIG. 1). In some examples, monitored electrical component 280 is a rechargeable battery. Without limitation, the monitored parameters may include a voltage across monitored electrical component 280, a current through monitored electrical component 280, a temperature of monitored electrical component 280. The monitored parameters are transferred to controller 220, which analyses the monitored parameters and determines whether any adjustments are needed. If adjustments are needed for a given modular subsystem, controller 220 provides adjustment control signals to the given modular subsystem. Each of modular subsystems 285A-285N includes a respective adjustment controller 266, which is configured to adjust operations of a respective monitored electrical component 280 based on any adjustment control signals received from controller 220. Each respective secondary communication circuit 260, processing circuit 264, and adjustment controller 266 may together be referred to as a monitor circuit.

In some examples, primary communication circuit 240 is an integrated circuit with wired transceiver 242 and wireless transceiver 250. Wired transceiver 242 is coupled to controller 220 and is configured to send data to and receive data from controller 220 via wired coupling 230. Wired transceiver 242 is also configured to send data to or receive data from wireless transceiver 250. In addition, wireless transceiver 250 is configured to send data to or receive data from other wireless transceivers (e.g., wireless transceiver 270 of each secondary communication circuit 260 for each respective modular subsystem 285A-285N).

In the example of FIG. 2, wireless transceiver 250 includes primary wireless node 252, which includes circuitry and related programming/instructions to support a wireless network stack. As shown, primary wireless node 252 includes network formation circuitry 254 configured to establish a wireless network between primary wireless node 252 in communication with controller 220 and secondary wireless node 272 in communication with or part of a given modular subsystem. Primary wireless node 250 also includes data transfer circuitry 256 configured to perform data transfers between primary wireless node 252 and each secondary wireless node 272.

As shown, secondary communication circuit 260 includes a wireless transceiver 270 with secondary wireless node 272. Secondary wireless node 272 includes circuitry and related programming/instructions to support a wireless network stack. As shown, secondary wireless node 272 includes network formation circuitry 274 configured to establish a wireless network between secondary wireless node 272 in communication with a given processing circuit 264 and primary wireless node 252 in communication with controller 220. As another option, secondary wireless node 272 of different modular subsystems may communicate wirelessly with each other. Secondary wireless node 272 also includes data transfer circuitry 276 configured to perform data transfers between secondary wireless node 272 and primary wireless node 252. As another option, data transfers occur between the secondary wireless nodes of different modular subsystems.

In some examples, a device may include a communication circuit (e.g., primary communication circuit 240 or secondary communication circuit 260) for communications between controller (e.g., controller 220) and a subsystem (e.g., one of modular subsystems 285A-285N) with a monitored electrical component (e.g., monitored electrical component 280). The communication circuit may include network formation circuitry (e.g., network formation circuitry 254 or 274) configured to establish a wireless network between a primary wireless node (e.g., primary wireless node 252) in communication with the controller and a secondary wireless node (e.g., secondary wireless node 272) in communication with the subsystem. The communication circuit also includes data transfer circuitry (e.g., data transfer circuitry 256 or 276) configured to perform data transfers between the primary wireless node and the secondary wireless node.

In some examples, the network formation circuitry and the data transfer circuitry are part of a wireless transceiver (e.g., wireless transceiver 250 or 270 shown in FIG. 2) adapted to be coupled to an antenna. Further, the communication circuit may include a wired transceiver (e.g., wired transceiver 242 or 262 shown in FIG. 2) adapted to be coupled to the subsystem or the controller. The wireless transceiver may include an RF module, while the wired transceiver may include a UART transceiver.

Figure 3:
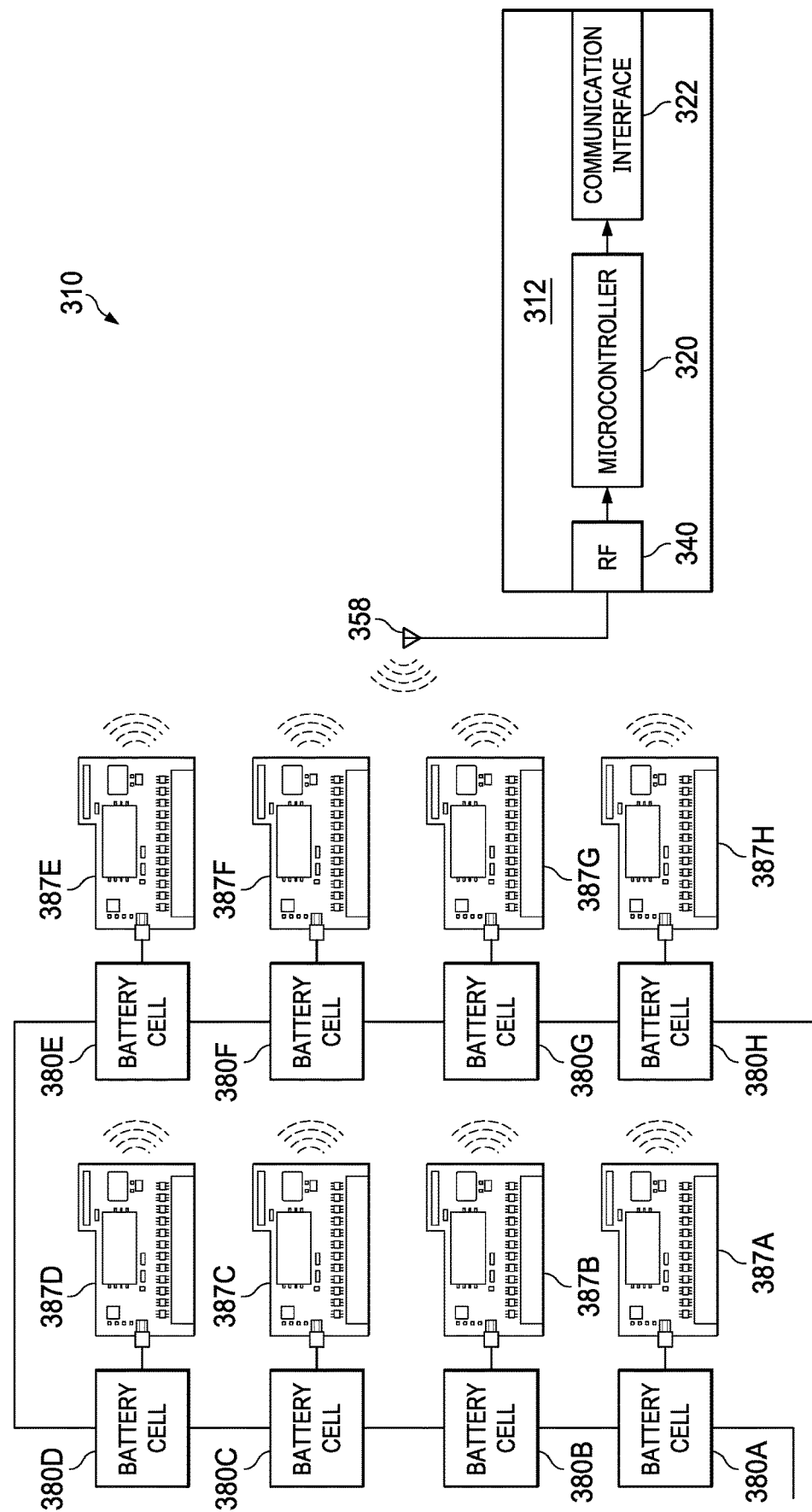

FIG. 3 is a conceptual block diagram of a control circuit 312 wirelessly coupled to a plurality of monitor circuits 387A-387H according to some aspects of the present disclosure. As shown, system 310 includes battery cells 380A-380H (e.g., Li-ion cells) in series. Each of battery cells 380A-380H is coupled to a respective monitor circuit 387A-387H (examples of communication circuit 260 and processing circuit 264 shown in FIG. 2) to form respective modular subsystems (e.g., battery cell 380A and monitor circuit 387A are an example of a modular subsystem as described herein). Each of monitor circuits 387A-387H may perform monitoring, adjustment, wired transceiver operations, wireless transceiver operations, and/or data integrity operations as described herein. Although system 310 is shown in FIG. 3 as including eight battery cells 380A-380H and eight monitor circuits 387A-387H, system 310 may include other numbers of components 380A-380H and 387A-387H, such as more than eight or fewer than eight.

In the example shown in FIG. 3, system 310 includes control circuit 312 (an example of control circuit 212 shown in FIG. 2) with microcontroller 320 (an example of controller 220 shown in FIG. 2), primary communication circuit 340 (an example of primary communication circuit 250 shown in FIG. 2), and communication interface 322 (an example of communication interface 222 shown in FIG. 2). In the example shown in FIG. 3, microcontroller 320 and primary communication circuit 340 communicate via a wired transceiver protocol such as a UART protocol, an SPI protocol, or another wired transceiver protocol. Also, communication interface 322 may be a vehicle communication interface such as a CAN interface, an Ethernet interface, or other communication interface. Microcontroller 320 may be configured to communicate with a host application or a safety microcontroller via communication interface 322. Additionally or alternatively, the host application or safety microcontroller may be part of microcontroller 320 and/or part of control circuit 312. As shown, control circuit 312 is coupled to antenna 358 for wireless communications with monitor circuits 387A-387H. In operation, primary communication circuit 340 is configured to perform wired transceiver options, wireless transceiver options, and data integrity operations as described herein.

In system 310, battery cells 380A-380H are connected in series, and monitor circuits 387A-387H may be configured to monitor and adjust the combined functionality of all of battery cells 380A-380H. For example, the performance of battery cells 380A-380H may degrade over time. In such case, adjustment or replacement of a specific one of battery cells 380A-380H or components of monitor circuits 387A-387H may be needed. By using primary communication circuit 340 and the secondary communication circuits onboard monitor circuits 387A-387H for wireless data transfers between microcontroller 320 and monitor circuits 387A-387H, such replacement is facilitated while supporting monitoring, adjustment, status update, parameter transfer, and/or other operations related to battery cells 380A-380H. Through the use of data integrity operations, system 310 ensures a target level of safety for battery management system operations while taking advantage of the benefits of wireless connectivity for the data transfers between microcontroller 320 and monitor circuits 387A-387H.

After the components of system 310 are manufactured, each of monitor circuits 387A-387H will be coupled to a respective one of battery cells 380A-380H. Monitor circuit 387A-387H may be coupled to battery cells 380A-380H immediately after production, or as late as just before installation into a larger system (e.g., a vehicle). After production testing, the components of system 310 will be placed into storage and eventually transported to another facility for installation into the larger system. Control circuit 312 may continue to test monitor circuits 387A-387H during storage, transport, and/or assembly in order to identify faults in system 310.

Control circuit 312 may be configured to operate in a distinct mode for each environment. Each mode may be associated with parameters, such as the network formation, testing protocol, size of the network, and how often the nodes communicate. The parameters for each mode may be preset within control circuit 312 and/or monitor circuits 387A-387H. Although not described in depth in this disclosure, circuits 312 and 387A-387H may be configured to operate in additional modes, such as an operating mode for while system 300 is installed in a vehicle.

Figure 4:
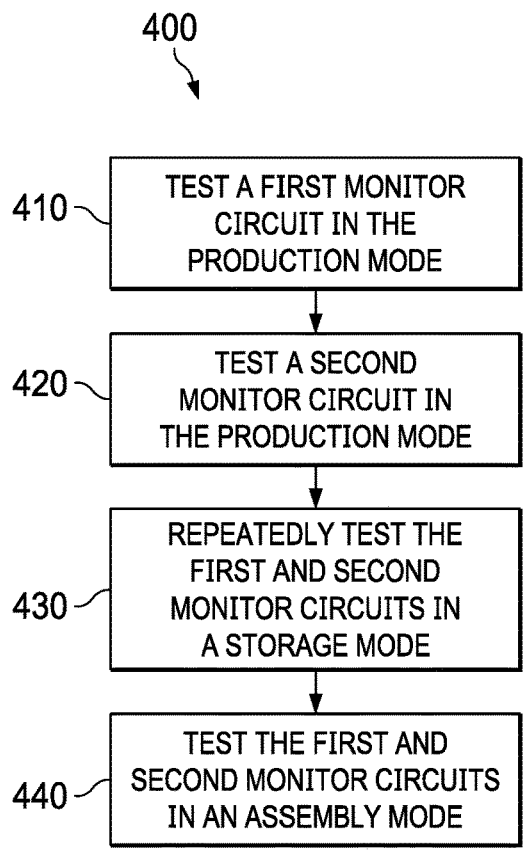
FIG. 4 is a flow diagram of a method for testing monitor circuits according to some aspects of the present disclosure.

FIG. 4 is a flow diagram of a method 400 for testing monitor circuits according to some aspects of the present disclosure. Some processes of the method 400 may be performed in orders other than described, and many processes may be performed concurrently in parallel. Furthermore, processes of the method 400 may be omitted or substituted in some examples of the present disclosure. The method 400 is described with reference to control circuit 312, microcontroller 320, and primary communication circuit 340 shown in FIG. 3, although other components such as controller 120, primary network node 140, control circuit 212, controller 220, primary communication circuit 240, and/or primary wireless node 250 shown in FIGS. 1 and 2 may exemplify similar techniques.

Referring to block 410, while in a production mode, control circuit 312 tests monitor circuit 387A. To test monitor circuit 387A, microcontroller 320 may begin operating in the production mode in response to, for example, a prompt from a host application and/or a safety microcontroller (not shown in FIG. 3) via communication interface 322. In some examples, microcontroller 320 will be configured to execute host application instructions, and/or the safety microcontroller will be part of control circuit 312 and coupled to microcontroller 320. While operating in the production mode, microcontroller 320 may be configured to cause primary communication circuit 340 to transmit network information, e.g., as part of a broadcast or multicast sent by control circuit 312 to monitor circuits 387A-387H. The network information may include a preconfigured network identification value.

After receiving the network information from control circuit 312, monitor circuit 387A can send a responsive message to control circuit 312. Monitor circuit 387A may be configured to send the responsive message as a unicast message. To decrease an amount of time spent forming the network, circuits 312 and 387A-387H may perform mutual authentication and key exchange concurrently with the scanning and pairing. For example, circuits 312 and 387A-387H may be configured to establish a secure communication channel using a public key algorithm, such as Diffie-Hellman Key Exchange, or any other suitable key algorithm. Additional example details of establishing a secure communication channel can be found in commonly assigned U.S. patent application Ser. No. 17/233,106, entitled "Wireless Protocol for Battery Management," filed on Apr. 16, 2021; and U.S. patent application Ser. No. 17/399,793, entitled "Wireless Battery Management System Setup," filed on Aug. 11, 2021, each of which is incorporated by reference in its entirety. Additionally or alternatively, circuits 312 and 387A-387H may use a preconfigured network identification value as the network key without negotiation.

Once monitor circuit 387A and control circuit 312 have set up a communication channel while in the production mode, control circuit 312 can test monitor circuit 387A by determining whether data received from monitor circuit 387A is acceptable. For example, control circuit 312 may request data from monitor circuit 387A such as a voltage measurement, a current measurement, a temperature measurement, or any other value stored in a register in monitor circuit 387A. Microcontroller 320 can compare the measurement or other data received from monitor circuit 387A to a minimum level, a maximum level, an acceptable range, and/or any other threshold value.

Microcontroller 320 can determine that monitor circuit 387A has passed a test by determining that the data received from monitor circuit 387A is acceptable. Microcontroller 320 may be configured to continue requesting data from monitor circuit 387A and evaluating the received data until microcontroller 320 has completed a round of testing of monitor circuit 387A. For example, microcontroller 320 may request a first value stored in a first register on monitor circuit 387A, evaluate the first value after receiving it from monitor circuit 387A, request a second value stored in a second register on monitor circuit 387A, and so on. Microcontroller 320 may request these values to determine whether monitor circuit 387A has been manufactured properly without defects. In some examples, microcontroller 320 can use the data received from monitor circuits 387A-387H to perform cell balancing. Based on this comparison, microcontroller 320 may be configured to determine whether there are any faults, defects, or errors in monitor circuit 387A or battery cell 380A. Responsive to determining that no faults, defects, or errors exist, control circuit 312 may command monitor circuit 387A to reset. Resetting monitor circuit 387A may allow for monitor circuit 387A to form new security credentials after the reset.

Referring to block 420, while in the production mode, control circuit 312 tests monitor circuit 387B. As described with respect to block 410, control circuit 312 may be configured to transmit network information to monitor circuits 387A-387H. In examples in which both of monitor circuits 387A and 387B respond to the transmission of network information, control circuit 312 can test monitor circuit 387A first and therefore test monitor circuit 387B.

Control circuit 312 and monitor circuit 387B can set up a communication channel before monitor circuit 387A sends data to control circuit 312 for testing. Control circuit 312 may be configured to test whether the data received from monitor circuit 387B is acceptable. Microcontroller 320 can compare the measurement or other data received from monitor circuit 387B to a minimum level, a maximum level, an acceptable range, and/or any other threshold value. Based on this comparison, microcontroller 320 may be configured to determine whether there are any faults, defects, or errors in monitor circuit 387B or battery cell 380B. Responsive to determining that no faults, defects, or errors exist, control circuit 312 may command monitor circuit 387B to reset.

After the manufacture of control circuit 312, battery cells 380A-380H, and monitor circuits 387A-387H, control circuit 312 may be configured to initiate the production mode while components 312, 380A-380H, and 387A-387H are still in the manufacturing facility. The integration of each of battery cells 380A-380H with each respective one of monitor circuits 387A-387H into a modular subsystem may occur before the testing in the production mode. Alternatively, for testing in the production mode, each monitor circuit can be connected to an external testing circuit that delivers electricity to the monitor circuit, and components 380A-380H and 387A-387H may be integrated into a modular subsystem at a later time. While operating in the production mode, control circuit 312 can test the proper operation of components 380A-380H and 387A-387H and the proper integration of these components into modular subsystems. Control circuit 312 may be configured to verify the communication between control circuit 312 and monitor circuits 387A-387H, as well as the data that is sent by monitor circuits 387A-387H to control circuit 312.

Control circuit 312 may be configured to perform a reset operation after testing each of monitor circuit 387A-387H. For example, in response to determining that no fault or defect exists in monitor circuit 387A, control circuit 312 may be configured to command monitor circuit 387A to reset. Control circuit 312 may thereafter perform a reset operation by powering off and rebooting, by exiting the production mode, and/or by restarting the production mode. After resetting, control circuit 312 can proceed with testing monitor circuit 387B.

While operating in the production mode, control circuit 312 may be configured to test each of monitor circuits 387A-387H once. That is, control circuit 312 may perform a round of testing on monitor circuit 387A, followed by a round of testing on monitor circuit 387B, followed by a round of testing on monitor circuit 387C, and so on. After determining that monitor circuit 387A has passed the round of testing performed in the production mode, control circuit 312 may be configured to refrain from testing monitor circuit 387A again until control circuit 312 is operating in the storage mode or assembly mode.

Referring to block 430, while operating in a storage mode, control circuit 312 repeatedly tests monitor circuits 387A-387H more than once. To test monitor circuits 387A-387H, control circuit 312 may first establish a network with monitor circuits 387A-387H. Microcontroller 320 may be prompted to begin operating in the storage mode by a prompt from the host application and/or a safety microcontroller. Additionally or alternatively, microcontroller 320 may begin operating in the storage mode in response to a trigger such as detecting that control circuit 312 is located in a storage container or a transport container. For example, microcontroller 320 may include an input node configured to receive the trigger from a source outside of control circuit 312. Microcontroller 320 may be configured to store configuration settings specifying at what time or in response to what trigger(s) microcontroller 320 should start and complete each operating mode. In response to entering the storage mode, control circuit 312 may be configured to send network information to monitor circuits 387A-387H. The network information may also include a command from control circuit 312 causing monitor circuits 387A-387H to enter the storage mode. While in the storage mode, components 312 and 387A-387H can set up a network using the same process as described herein for the production and assembly modes.

The number of monitor circuits in communication with control circuit 312 may be larger in the storage mode than the number of monitor circuits in communication with control circuit 312 in the production mode or in the assembly mode. For example, while in the storage mode, control circuit 312 may be configured to monitor any number of monitor circuits, from five or ten to several hundred or more monitor circuits. The number of monitor circuits with which control circuit 312 is configured to communicate in each mode can be preset and/or programmed by a user. A designer may select the number of monitor circuits based on a tradeoff between cost and responsiveness, where a higher number may result in slower response times and lower costs due to fewer control circuits. While operating in the storage mode, control circuit 312 may be capable of communicating with and testing such a large number of monitor circuits because each monitor circuit may send data to control circuit 312 less often, as compared to how often monitor circuits send data to control circuit 312 while operating in the production and assembly modes. In addition, when installed in a final system such as a vehicle, monitor circuits 387A-387H may be configured to communicate with control circuit 312 more often than during the storage mode (e.g., at least three times, five times, ten times, or twenty times more often).

For example, while in the production mode, control circuit 312 may be configured to test a first number of monitor circuits per minute. While in the storage mode, control circuit 312 may be configured to test a second number of monitor circuits per minute. While in the assembly mode, control circuit 312 may be configured to test a third number of monitor circuits per minute. The first number and/or third number may be larger than the second number or more than twice, five times, or twenty times as large as the second number. In some examples, the interval between communications between control circuit 312 and a particular monitor circuit may be proportional to the number of devices on the network. Control circuit 312 may command each of monitor circuits 387A-387H to send data at particular intervals, or monitor circuits 387A-387H may send data at predetermined intervals. In other words, how often each of monitor circuits 387A-387H sends data may be a parameter that is set by control circuit 312, or this parameter can be preset or preprogrammed in monitor circuits 387A-387H.

After production in a manufacturing facility, components 312, 380A-380H, and 387A-387H may be moved to a storage facility before assembly into a system (e.g., installation in a vehicle). Components 312, 380A-380H, and 387A-387H may also be transported from the manufacturing facility to the site for assembly into the system. Even while in a storage facility or on a transport vehicle, control circuit 312 may be configured to communicate with and test monitor circuits 387A-387H. By testing monitor circuits 387A-387H, control circuit 312 may ensure safe operation and may prevent any malfunctioning before monitor circuits 387A-387H are installed in the system. In some examples, components 312, 380A-380H, and 387A-387H are assembled and installed into a vehicle after coming off the production line, rather than being placed into storage and/or transported to another facility. In such examples, control circuit 312 may be configured to skip the storage mode and instead transition from the production mode to the assembly mode.

Control circuit 312 may be configured to repeatedly test monitor circuits 387A-387H (e.g., in an operating loop) until control circuit 312 receives a prompt or detects a trigger to exit the storage mode. Control circuit 312 can test monitor circuits 387A-387H more than once by testing monitor circuit 387A, then testing monitor circuit 387B, and so on, until after testing monitor circuit 387H, control circuit 312 tests monitor circuit 387A again.

Control circuit 312 may be configured to wait for a predetermined duration after finishing the testing of monitor circuit 387A before beginning to test monitor circuit 387B. Control circuit 312 may test monitor circuits 387A-387H less frequently in the storage mode than in the production and assembly modes because the purpose of testing in each mode may be different. For example, when battery cells 380A-380H are in storage, control circuit 312 may test to ensure that the temperatures are acceptable, that no fire or failure occurs, and that the energy stored in each of battery cells 380A-380H is not depleted. Because there is little or no risk of immediate danger, testing can occur less often in the storage mode, as compared to testing in other modes or after installation into a vehicle.

Referring to block 440, while operating in an assembly mode, control circuit 312 establishes a network with monitor circuits 387A-387H. Microcontroller 320 may be prompted to begin operating in the assembly mode in response to a prompt from the host application and/or from a safety microcontroller. Additionally or alternatively, microcontroller 320 can enter the assembly mode in response to determining that control circuit 312 is located in the assembly facility. In response to entering the assembly mode, control circuit 312 may be configured to send network information to monitor circuits 387A-387H. The network information may include a command from control circuit 312 causing monitor circuits 387A-387H to begin operating in an assembly mode. While in the assembly mode, components 312 and 387A-387H can set up a network using the same process as described herein for the production and storage modes.

The number of monitor circuits in communication with control circuit 312 in the assembly mode may be the same as the number of monitor circuits in communication with control circuit 312 when the system (e.g., vehicle) is operational. In other words, if eight monitor circuits 387A-387H are installed in the vehicle, control circuit 312 may communicate with these eight monitor circuits 387A-387H while control circuit 312 is operating in the assembly mode. While in the assembly mode, control circuit 312 may be configured to test monitor circuits 387A-387H until all of the circuits have passed the testing or have been replaced. This testing protocol reduces the likelihood that any defective components are installed in the vehicle.

FIG. 4 depicts method 400 as including operation in the storage mode after the production mode and before the assembly mode. However, a control circuit may be configured to transition to the assembly mode directly from the production mode, rather than operating in the storage mode. The control circuit may transition to the assembly mode from the production mode for one or more of the reasons described herein, such as in response to detecting a trigger event.

Figure 5:
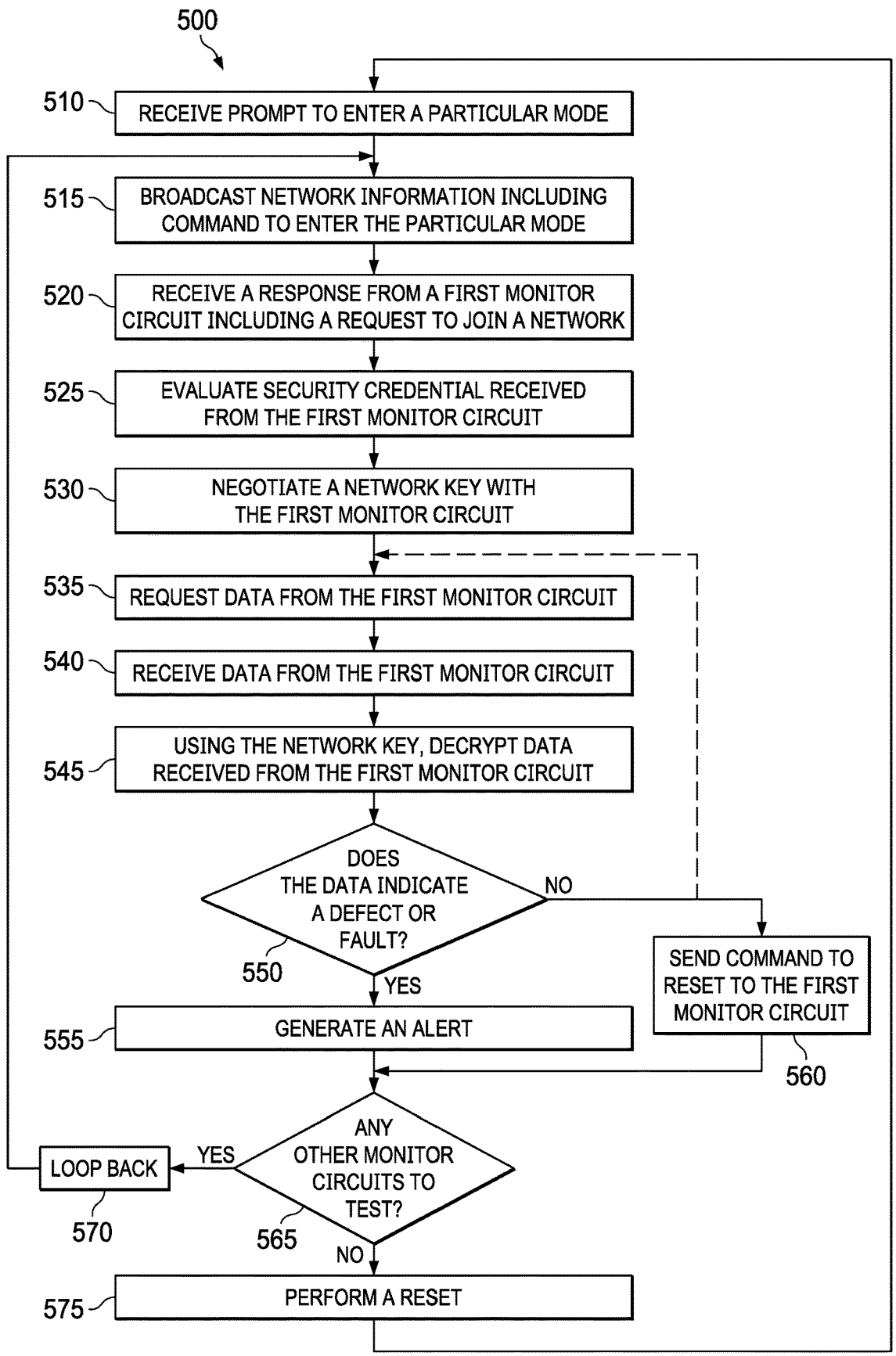
FIG. 5 is a flow diagram of a method for communicating with monitor circuits in a production mode according to some aspects of the present disclosure.

FIG. 5 is a flow diagram of a method 500 for communicating with monitor circuits in a production mode according to some aspects of the present disclosure. Some processes of the method 500 may be performed in orders other than described, and many processes may be performed concurrently in parallel. Furthermore, processes of the method 500 may be omitted or substituted in some examples of the present disclosure. The method 500 is described with reference to control circuit 312, microcontroller 320, and primary communication circuit 340 shown in FIG. 3, although other components such as controller 120, primary network node 140, control circuit 212, controller 220, primary communication circuit 240, and/or primary wireless node 250 shown in FIGS. 1 and 2 may exemplify similar techniques.

Referring to block 510, microcontroller 320 receives a prompt to enter a particular mode, such as a production mode, a storage mode, and/or an assembly. Microcontroller 320 may receive this prompt from a host application, from a safety microcontroller, or from another entity. Responsive to receiving this prompt, microcontroller 320 may enter the particular mode by executing software instructions for the production mode. Each operating mode may be implemented as a software routine and may be associated with characteristics such as the number of nodes in the network, how often control circuit 312 requests data from each of monitor circuits 387A-387H, the type of data that control circuit 312 requests from monitor circuits 387A-387H, and/or any other characteristic or parameter.

Referring to block 515, control circuit 312 broadcasts or multicasts network information, such as a certificate of control circuit 312. Along with the network information, control 312 may also broadcast or multicast a command to monitor circuits 387A-387H to enter the particular mode, although control circuit 312 may send this command separately from the network information. Control circuit 312 may be configured to generate the certificate by at least digitally signing publicly available information unique to control circuit 312, such as a device unique ID, using a private key of a trusted third party, such as a certificate authority. Each of monitor circuits 387A-387H can verify the authenticity of the certificate, and thereby verify that control circuit 312 sent the certificate, based on the publicly available information unique to control circuit 312 and a public key (e.g., a public authentication key) of the trusted third party.

One or more of the operating modes described herein may have a relaxed or simplified procedure for setting up a network between control circuit 312 and one or more of monitor circuits 387A-387H. The simplified procedure may include encrypting communications (e.g., messages) among circuits 312 and 387A-387H using a preconfigured network identification value that is pre-loaded onto a memory of each of circuits 312 and 387A-387H. Circuits 312 and 387A-387H can perform this simplified procedure without having to negotiate a separate network key for encrypting communications. In some examples, circuits 312 and 387A-387H may use this simplified procedure while operating in the production mode.

After broadcasting the network information, control circuit 312 may wait for antenna 358 to receive a request from one of monitor circuits 387A-387H to join the network. Before broadcasting or multicasting the network information to monitor circuits 387A-387H, control circuit 312 may begin operating in a production mode (e.g., prompted by a host application or a safety microcontroller). While operating in the production mode, control circuit 312 may be configured to test each of monitor circuits 387A-387H for defects.

Referring to block 520, primary communication circuit 340 receives a response from monitor circuit 387A, which may include a request from monitor circuit 387A to join a network with control circuit 312. In sending the response to control circuit 312, monitor circuit 387A may send a security credential such as a certificate of monitor circuit 387A to control circuit 312. Before sending the response to control circuit 312, monitor circuit 387A may be configured to verify the network information received by monitor circuit 387A from control circuit 312. Each of monitor circuits 387A-387H may be configured to generate a certificate by at least digitally signing publicly available information unique to that monitor circuit, such as a device unique ID, using a private key of a trusted third party, such as Certificate Authority. Control circuit 312 can verify the authenticity of the certificate, and thereby verify which monitor circuit sent the certificate, based on the publicly available information unique to that monitor circuit and a public key (e.g., a public authentication key) of the trusted third party.

Referring to block 525, microcontroller 320 evaluates the security credential received from monitor circuit 387A. For example, microcontroller 320 can verify the certificate received from monitor circuit 387A. Microcontroller 320 may be configured to proceed to block 530 in response to determining that monitor circuit 387A has a valid security credential. Microcontroller 320 can use an allow list and/or a deny list to determine whether a specific monitor circuit has a valid security credential. In response to determining that monitor circuit 387A does not have a valid security credential, microcontroller 320 may be configured to not proceed to block 530. In addition, microcontroller 320 may be configured to generate an alert indicating that monitor circuit 387A has not provided a valid security credential to control circuit 312.

Referring to block 530, control circuit 312 negotiates a network key with monitor circuit 387A. Each time that control circuit 312 establishes a network with one of monitor circuits 387A-387H, control circuit 312 may be configured to generate a new network key. Microcontroller 320 may be configured to compute the network key based on the certificate received from monitor circuit 387A. Control circuit 312 may be configured to then encrypt the network key and transmit the encrypted version of the key to monitor circuit 387A. Each device in the network may have a unique network key. Microcontroller 320 may be configured to use a secure key derivation function to generate the network key. In some examples, microcontroller 320 computes the shared secret according to the public key of monitor circuit 387A and a private key (e.g., private authentication key) of microcontroller 320. After computing the shared secret, microcontroller 320 may encrypt a network key according to the shared secret, which may also be referred to as an ephemeral key. Control circuit 312 may then transmit a pairing request, as well as the encrypted network key, to monitor circuit 387A. Additional example details of network key generation can be found in commonly assigned U.S. patent application Ser. No. 17/314,865, entitled "Key Refreshment with Session Count for Wireless Management of Modular Subsystems," filed on May 7, 2021, which is incorporated by reference in its entirety.

Referring to block 535, control circuit 312 requests data from monitor circuit 387A. Before sending the request to monitor circuit 387A, control circuit 312 may encrypt the request using the network key, and/or control circuit 312 may send the request and the network key together. Along with sending the network key and/or sending the data request, control circuit 312 may be configured to send a command to enter a particular mode to monitor circuit 387A. Control circuit 312 may be configured to request data that is stored in a register (e.g., a status register) in monitor circuit 387A.

Referring to block 540, control circuit 312 receives the requested data from monitor circuit 387A. Control circuit 312 may receive the data in a wireless transmission via antenna 358. Referring to block 545, microcontroller 320 decrypts the data received from monitor circuit 387A using the network key. Referring to block 550, microcontroller 320 determines whether the data received from monitor circuit 387A indicates a defect or fault. To check for a defect or fault, microcontroller 320 may be configured to determine whether the received data is acceptable based on a threshold level, a threshold range, and/or a target value for one or more values in the received data.

Referring to block 555, in response to determining that the received data indicates a defect or fault, control circuit 312 generates an alert indicating that the data is not acceptable and proceeds to block 565. For example, control circuit 312 can determine that a fault exists in response to determining that the voltage across battery cell 380A is unacceptably low or that the temperature of battery cell 380A is unacceptably high. Control circuit 312 can issue the alert to the host application and/or to a safety microcontroller indicating which of monitor circuits 387A-387H and battery cells 380A-380H has the fault or defect.

In response to determining that the received data does not indicate a defect or fault, control circuit 312 loops back to block 535 and request additional data from monitor circuit 387A. Control circuit 312 may continue looping back to block 535 and requesting more data include control circuit 312 has completed testing monitor circuit 387A. Referring to block 555, in response to determining that the received data does not indicate a defect or fault, control circuit 312 sends a command to reset to monitor circuit 387A and proceeds to block 565. After resetting, monitor circuit 387A may be configured to wait to receive network information or another command from control circuit 312.

Referring to block 565, control circuit 312 determines whether to test another one of monitor circuits 387A-387H. Control circuit 312 may receive a response from each of monitor circuits 387A-387H after sending the network information in block 515. Additionally or alternatively, monitor circuit 387B may be configured to send the request during a timeslot assigned to monitor circuit 387B by control circuit, where this timeslot may be after control circuit 312 has finished testing monitor circuit 387A. Control circuit 312 may be configured to control the configuration of the superframe and/or nodes in the network, and control circuit 312 may use a single or multiple slots setting.

Referring to block 570, in response to determining that another one of monitor circuits 387A-387H will be tested, control circuit 312 proceeds to block 515 and re-broadcasts the network information. Control circuit 312 may need to re-broadcast the network information because monitor circuits are continually rolling off the production line into the testing environment. The next monitor circuit to be tested may not have received the previous broadcast. Control circuit 312 may be configured to perform blocks 515-560 of method 500 for each of monitor circuits 387A-387H that responds. Before proceeding to block 515, control circuit 312 may reset by powering off and rebooting or by exiting the testing subroutine associated with monitor circuit 387A. Referring to block 575, in response to determining that none of monitor circuits 387A-387H will be tested, control circuit 312 resets and proceeds to block 510 and waits to receive a prompt from a host application or a safety microcontroller.

Figure 6:
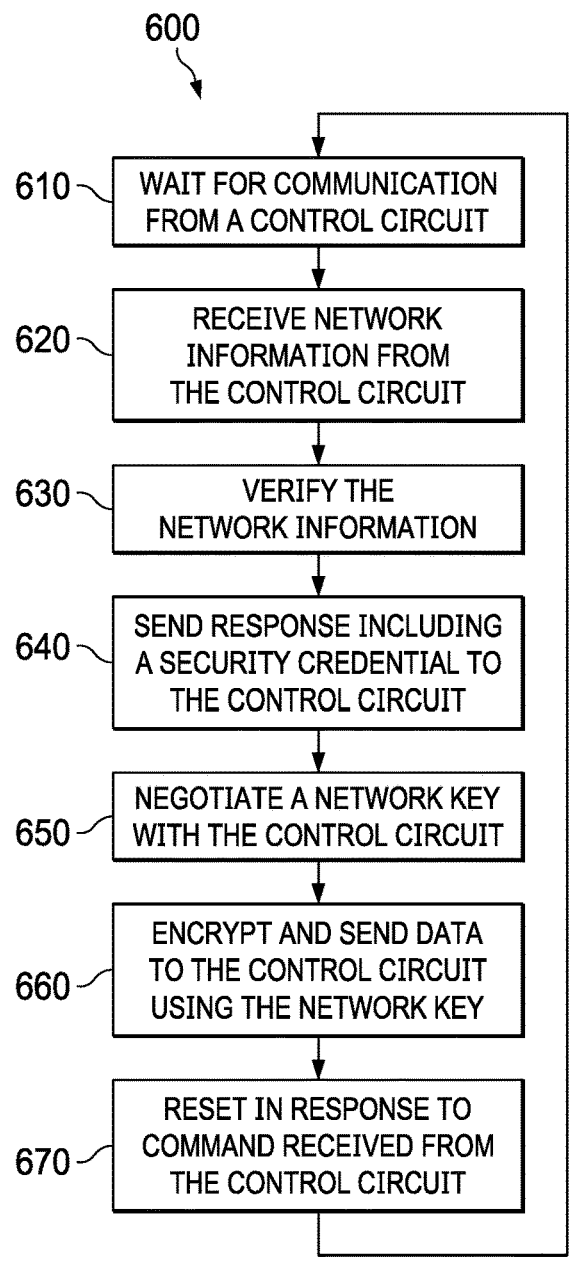
FIG. 6 is a flow diagram of a method of operation for a monitor circuit according to some aspects of the present disclosure.

FIG. 6 is a flow diagram of a method for communicating with a monitor circuit according to some aspects of the present disclosure. Some processes of the method 600 may be performed in orders other than described, and many processes may be performed concurrently in parallel. Furthermore, processes of the method 600 may be omitted or substituted in some examples of the present disclosure. The method 600 is described with reference to monitor circuits 387A-387H shown in FIG. 3, although other components such as secondary network nodes 160, secondary communication circuit 260, secondary wireless node 272, and/or modular subsystems 285A-285N shown in FIGS. 1 and 2 may exemplify similar techniques.

Referring to block 610, monitor circuit 387A waits to receive a communication from control circuit 312. While waiting, monitor circuit 387A may be configured to sense the electrical parameters and temperature of battery cell 380A. Monitor circuit 387A may include memory (e.g., registers), and monitor circuit 387A can store the sensed data values in the memory. While waiting in block 610, monitor circuit 387A may not be operating in a production mode, storage mode, or assembly mode.

Referring to block 620, monitor circuit 387A receives network information from control circuit 312. The network information may be sent by control circuit 312 as a broadcast message or multicast message to some or all of monitor circuits 387A-387H. The network information received by monitor circuit 387A from control circuit 312 may include a certificate. Referring to block 630, after receiving the network information, monitor circuit 387A may be configured to verify the certificate sent by control circuit 312. If monitor circuit 387A cannot verify the network information, monitor circuit 387A may be configured to refrain from sending a response or data to control circuit 312.

The network information received from control circuit 312 may also include a command from control circuit 312 to enter a particular operating mode, such as a production mode, a storage mode, or an assembly mode. Monitor circuit 387A may be preprogrammed to operate in these modes, and monitor circuit 387A may execute specific instructions or routines while operating in each mode. When executing the routine associated with a particular mode, monitor circuit 387A may be configured to operate based on characteristics or parameters such as how often to report data to control circuit 312, the type of data values to report to control circuit 312, and other parameters.

Referring to block 640, monitor circuit 387A sends a response including a security credential to control circuit 312. The security credential may be a certificate associated with monitor circuit 387A. Monitor circuit 387A can retrieve the security credential from a memory in monitor circuit 387A and send the security credential to control circuit 312 as part of the request. In some examples, monitor circuit 387A will send the security credential to control circuit 312 only after monitor circuit 387A verifies the network information. The response sent by monitor circuit 387A functions as a request by monitor circuit 387A to join a network with control circuit 312.

Referring to block 650, monitor circuit 387A negotiates a network key with control circuit 312 after sending the response. Circuits 312 and 387A can begin negotiating the network key after control circuit 312 verifies the security credential sent by monitor circuit 387A. In some examples, the network key is different from a pre-shared key stored in either of circuits 312 and 387A. Monitor circuit 387A may be configured to compute the network key based on the pre-shared key stored in memory onboard monitor circuit 387A. Monitor circuit 387A may be configured to use a secure key derivation function to generate the network key. Alternatively, circuits 312 and 387A can use a preconfigured network identification value to encrypt communications without negotiating a network key.

After negotiating the network key with control circuit 312, monitor circuit 387A may receive a request for data from control circuit 312. For example, control circuit 312 may request a value that is stored to a register in monitor circuit 387A, such as a voltage measurement or a temperature measurement obtained by monitor circuit 387A. Referring to block 660, monitor circuit 387A encrypts data using the network key and sends the encrypted data to control circuit 312. Monitor circuit 387A may send the data in response to a request received by monitor circuit 387A from control circuit 312. In some examples, monitor circuit 387A sends the data as part of a predetermined routine for the production mode, without having received an explicit request for data from control circuit 312. Monitor circuit 387A may receive multiple requests for data from control circuit 312, and monitor circuit 387A may respond by sending the requested data.

Referring to block 670, monitor circuit 387A resets in response to a command received by monitor circuit 387A from control circuit 312. To perform a reset, monitor circuit 387A may be configured to exit the production mode and wait for further instructions from control circuit 312. Additionally or alternatively, to perform a reset, monitor circuit 387A may be configured to power off and reboot. After resetting, monitor circuit 387A may be configured to proceed to block 610 and wait for a command or a trigger before entering another operating mode.

Figure 7:
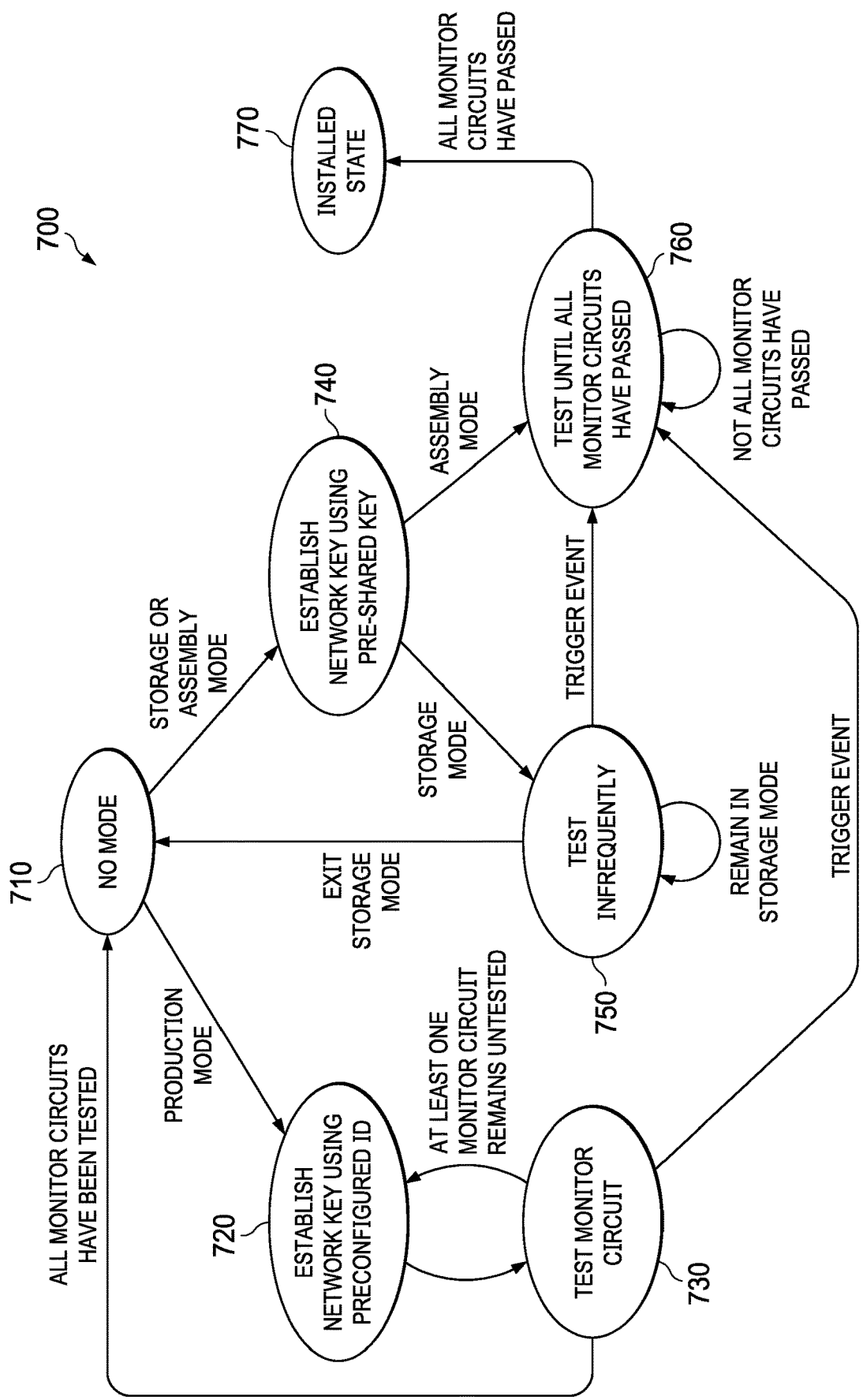
FIG. 7 is a state diagram for a control circuit in a monitoring system according to some aspects of the present disclosure.

FIG. 7 is a state diagram 700 for a control circuit in a monitoring system according to some aspects of the present disclosure. State diagram 700 includes the following states for the sequencer: no mode state 710, network setup states 720 and 740, testing states 730, 750, and 760, and optional installed mode 770. State diagram 700 may be implemented by a control circuit such as controller 120 and primary network node 140 shown in FIG. 1, control circuit 212 shown in FIG. 2, or control circuit 312 shown in FIG. 3.

When in no mode state 710, the control circuit waits to receive a prompt, trigger, or indicator to enter a production mode, a storage mode, or an assembly mode. For example, the control circuit may receive a prompt from a host application or a safety microcontroller to enter a mode. Additionally or alternatively, the control circuit may be configured to enter a mode in response to determining that a trigger or indicator has occurred. For example, the control circuit may determine that it is in a production environment, a storage environment, or an assembly environment and, in response to this determination, enter one of the modes.

After transitioning from no mode state 710 to a production mode, the control circuit may go to network setup state 720, where the control circuit establishes a network key with a first monitor circuit using a preconfigured network identification value. The control circuit and the first monitor circuit can use a preconfigured network identification value to simplify the scanning and pairing procedures for setting up a network key. For example, the circuits may exchange preconfigured network identification values as part of a verification process, rather than verifying certificates, before determining a network key. The preconfigured network identification value may be pre-loaded onto the control circuit and the monitor circuits. The circuits may use the preconfigured network identification value to encrypt messages without having to negotiate a network key, as may be the case for setting up the storage mode and the assembly mode.

After establishing the network key, the control circuit moves to testing state 730, where the control circuit tests the first monitor circuit using the network key. The testing may include multiple requests for data by control circuit and multiple responses with the requested data from the first monitor circuit. The communication between the circuits may be unicast, broadcast, and/or multicast in testing states 730, 750, and 760. In some examples, the communication is unicast in testing state 730 and broadcast in testing states 750 and 760.

After the control circuit finishes testing the first monitor circuit, the control circuit returns to network setup state 720 in response to determining that a second monitor circuit has not been tested. The control circuit can establish a network key with the second monitor circuit in state 720 and proceed to state 730 to test the second monitor circuit by requesting data. Although not shown in FIG. 7, in some examples state diagram 700 may include a transition path directly from testing state 730 to testing state 750 without returning to no mode state 710. After the control circuit finishes testing the second monitor circuit, the control circuit returns to no mode state 710 in response to determining that all of the monitor circuits have been tested.

Alternatively, the control circuit may be configured to transition directly from testing state 730 to testing state 760 by skipping testing state 750. The control circuit can perform this transition in response to detecting a trigger event, such as a command from a safety microcontroller or host application. In some examples, the control circuit may be programmed during the manufacture process to skip the storage mode, and/or the control circuit may be programmed with only two modes: production mode and assembly mode. This programming may be useful in a supply chain setting where there is no storage state because the battery pack is assembled and installed at the site of the production testing. The control circuit need not pass through no mode state 720 and/or testing state 750 in all examples but may instead transition to testing state 760 immediately after completing testing state 730. Once the control circuit has completed the production mode, the control circuit may be configured to refrain from re-entering the production mode again.

After transitioning from no mode state 710 to a storage mode or an assembly mode, the control circuit may go to network setup state 740, where the control circuit establishes a network key with a first monitor circuit using a pre-shared key. For the storage and assembly modes, the control circuit can broadcast network information including a certificate. In response to verifying the certificate, a first monitor circuit can send a certificate to the control circuit. After the control circuit verifies the certificate from the first monitor circuit, the circuit can negotiate a network key.

After establishing the network key, the control circuit moves to testing state 750 or 760, depending on the operating mode. For storage mode, the control circuit moves to testing state 750, where the control circuit infrequently tests the monitor circuits until exiting the storage mode and returning to no mode state 710. In some examples, the control circuit tests each monitor circuit less than once per minute, less than once per two minutes, less than once per five minutes, less than once per twenty minutes, or less than once per hour. The control circuit and/or the monitor circuits may enter a power saving mode between tests while operating in the storage mode. The control circuit may be configured to exit the storage mode based on an input signal, based on a sensed parameter, and/or based on configuration settings. In some examples, the control circuit may be configured to transition directly from testing state 750 to testing state 760, for example, in response to detecting a trigger event, such as a command from a safety microcontroller or host application. The control circuit can transition directly from testing state 750 to testing state 760 in response to detecting a change in the configuration parameters of the control circuit. The configuration parameters may change when the circuits are taken out of a storage environment and moved to an assembly setting. Once the control circuit has completed the storage mode, the control circuit may be configured to refrain from re-entering the storage mode again. Instead, the control circuit may begin operating in the assembly mode after the control circuit receives a prompt or trigger.

While in assembly mode, the control circuit moves to testing state 760, where the control circuit tests the monitor circuits until all of the monitor circuits have passed the testing. Testing in assembly mode may include a fixed or predetermined number of monitor circuits in a network. In response to determining that a first monitor circuit has failed the testing while in testing state 760, the control circuit may be configured to generate an alert indicating that the first monitor circuit should be replaced. Responsive to determining that all of the components have passed testing or been replaced, the control circuit may transition to installed state 770. Alternatively, the control circuit may remain in testing state 760 in response to determining that all of the components have passed testing or been replaced.

During testing state 760, the control circuit and monitor circuits may be assembled into a battery pack for an electric vehicle or hybrid vehicle. Installation of the battery pack into the vehicle may occur in testing state 760 or during installed state 770. The control circuit may be configured to continue testing the monitor circuit after the assembly and installation is complete. The testing performed by the control circuit in installed mode 770 may be similar to the testing performed by the control circuit in testing mode 760.

State diagram 700 is just one example of how a control circuit can operate in a production mode, a storage mode, and an assembly mode. Although FIG. 7 shows a control circuit using a preconfigured network identification value in network setup state 720, a control circuit operating in a production mode may instead use a pre-shared key to negotiate a network key with a monitor circuit. Although FIG. 7 shows a control circuit testing each monitor circuit only once in testing state 730, a control circuit may instead test some or all of the monitor circuits more than once.

The following numbered aspects demonstrate one or more aspects of the disclosure.

Aspect 1. A method includes testing, by a control circuit operating in a production mode, the plurality of battery monitor circuits. The method also includes testing, by the control circuit operating in a storage mode, the plurality of battery monitor circuits more than once after testing the plurality of battery monitor circuits in the production mode. The method further includes testing, by the control circuit operating in an assembly mode, the plurality of battery monitor circuits after testing the plurality of battery monitor circuits in the storage mode.

Aspect 2. The method of the preceding aspect, including skipping the storage mode instead of testing the plurality of battery monitor circuits in the storage mode.

Aspect 3. The method of the preceding aspects or any combination thereof, further including testing the plurality of battery monitor circuits in the assembly mode immediately after testing in the production mode.

Aspect 4. The method of the preceding aspects or any combination thereof, further including, in the production mode, encrypting communications to the first battery monitor circuit using a preconfigured network identification value.

Aspect 5. The method of the preceding aspect, where the preconfigured network identification value is pre-loaded in a memory on the control circuit, and the preconfigured network identification value is pre-loaded in a memory on the first battery monitor circuit.

Aspect 6. The method of the two preceding aspects or any combination thereof, further including determining the preconfigured network identification value without negotiating with the first battery monitor circuit.

Aspect 7. The method of the preceding aspects or any combination thereof, further including, in the storage and assembly modes, negotiating a network key with the first battery monitor circuit.

Aspect 8. The method of the preceding aspect, in the storage and assembly modes, further including encrypting communications to the first battery monitor circuit using the network key.

Aspect 9. The method of the two preceding aspects or any combination thereof, where negotiating the network key includes sending a first certificate to the first battery monitor circuit, verifying a second certificate received from the first battery monitor circuit, and computing the network key based on the first and second certificates.

Aspect 10. The method of the preceding aspects or any combination thereof, further including performing, in the production mode, a single round of testing on the first battery monitor circuit.

Aspect 11. The method of the preceding aspect, further including, responsive to determining that the first battery monitor circuit has passed the single round of testing, and refraining from performing additional testing on the first battery monitor circuit until the control circuit is operating in the storage mode.

Aspect 12. The method of the two preceding aspects or any combination thereof, where performing the single round of testing includes requesting a first data value from the first battery monitor circuit, determining that the first data value received from the first battery monitor circuit is acceptable, requesting a second data value from the first battery monitor circuit after determining that the first data value is acceptable, and determining that the second data value received from the first battery monitor circuit is acceptable.

Aspect 13. The method of the three preceding aspects or any combination thereof, further including broadcasting network information at a first time, performing a first round of testing on the first battery monitor circuit after broadcasting the network information at the first time, broadcasting the network information at a second time after finishing the round of testing on the first battery monitor circuit, performing a second round of testing on a second battery monitor circuit after broadcasting the network information at the second time, broadcasting the network information at a third time after finishing the round of testing on the second battery monitor circuit, and exiting the production mode in response to determining that a request to join a network has not been received after broadcasting the network information at the third time.

Aspect 14. The method of the preceding aspects or any combination thereof, further including receiving messages from the first battery monitor circuit a first number of times per hour when installed in a vehicle, and receiving messages from the first battery monitor circuit a second number of times per hour when in the storage mode, where the first number is at least ten times larger than the second number.

Aspect 15. The method of the preceding aspects or any combination thereof, further including communicating with a first number of battery monitor circuits in the storage mode, and communicating with a second number of battery monitor circuits in the assembly mode, where the first number is at least two times larger than the second number.

Aspect 16. The method of the preceding aspects or any combination thereof, further including, in the assembly mode, testing the plurality of battery monitor circuits until all of the battery monitor circuits have either passed testing or been replaced.

Aspect 17. A system includes a plurality of battery monitor circuits and a control circuit configured to perform the method of the preceding aspects or any combination thereof.

Aspect 18. A system includes means for performing the method of aspects 1-16 or any combination thereof.

Aspect 19. A non-transitory computer-readable medium having executable instructions stored thereon, configured to be executable by processing circuitry for causing the processing circuitry to perform the method of aspects 1-16 or any combination thereof.

Aspect 20. A device including a transceiver circuit configured to communicate with a plurality of battery monitor circuits. The device also includes processing circuitry configured to perform the method of aspects 1-16 or any combination thereof.

Aspect 21. A system includes a control circuit and a plurality of battery monitor circuits including a first battery monitor circuit. In a production mode, the control circuit is configured to test the plurality of battery monitor circuits. In a storage mode after testing the plurality of battery monitor circuits in the production mode, the control circuit is configured to test the plurality of battery monitor circuits more than once. In an assembly mode after testing the plurality of battery monitor circuits in the storage mode, the control circuit is configured to test the plurality of battery monitor circuits.

Aspect 22. The system of the preceding aspect, where the control circuit is configured to skip the storage mode.

Aspect 23. The system of the two preceding aspects or any combination thereof, where the control circuit is configured to test the plurality of battery monitor circuits in the assembly mode immediately after testing in the production mode.

Aspect 24. The system of the three preceding aspects or any combination thereof, where the control circuit is further configured to test the plurality of battery monitor circuits in the assembly mode after testing the plurality of battery monitor circuits in the production mode by skipping the storage mode.

Aspect 25. The system of the four preceding aspects or any combination thereof, where, in the storage and assembly modes, the control circuit is configured to negotiate a network key with the first battery monitor circuit and encrypt communications to the first battery monitor circuit using the network key.

Aspect 26. The system of the five preceding aspects or any combination thereof, where, in the production mode, the control circuit is configured to encrypt communications to the first battery monitor circuit using a preconfigured network identification value.

Aspect 27. The system of the preceding aspect, where the control circuit includes a first memory, the first battery monitor circuit includes a second memory, and the preconfigured network identification value is pre-loaded in the first and second memories.

Aspect 28. The system of the two preceding aspects or any combination thereof, where the control circuit is configured to determine the preconfigured network identification value without negotiating with the first battery monitor circuit.

Aspect 29. The system of the three preceding aspects or any combination thereof, where the first battery monitor circuit is configured to determine the preconfigured network identification value without negotiating with the control circuit.

Aspect 30. The system of the four preceding aspects or any combination thereof, where the control circuit is configured to negotiate the network key by at least sending a first certificate to the first battery monitor circuit, verifying a second certificate received from the first battery monitor circuit, and computing the network key based on the first and second certificates.

Aspect 31. The system of the five preceding aspects or any combination thereof, where the first battery monitor circuit is configured to negotiate the network key by at least verifying a first certificate received from the control circuit, sending a second certificate to the control circuit, and computing the network key based on the first and second certificates.

Aspect 32. The system of the eleven preceding aspects or any combination thereof, where, in the production mode, the control circuit is configured to perform a single round of testing on the first battery monitor circuit. The control circuit is also configured to, responsive to determining that the first battery monitor circuit has passed the single round of testing, refrain from performing additional testing on the first battery monitor circuit until the control circuit is operating in the storage mode.

Aspect 33. The system of the preceding aspect, where to perform the single round of testing, the control circuit is configured to request a first data value from the first battery monitor circuit, determine that the first data value received from the first battery monitor circuit is acceptable, request a second data value from the first battery monitor circuit after determining that the first data value is acceptable, and determine that the second data value received from the first battery monitor circuit is acceptable.

Aspect 34. The system of the thirteen preceding aspects or any combination thereof, where the plurality of battery monitor circuits includes a second battery monitor circuit. In the production mode, the control circuit is configured to broadcast network information at a first time, perform a first round of testing on the first battery monitor circuit after broadcasting the network information at the first time, broadcast the network information at a second time after finishing the round of testing on the first battery monitor circuit, perform a second round of testing on the a second battery monitor circuit after broadcasting the network information at the second time, broadcast the network information at a third time after finishing the round of testing on the second battery monitor circuit, and exit the production mode in response to determining that a request to join a network has not been received after broadcasting the network information at the third time.

Aspect 35. The system of the fourteen preceding aspects or any combination thereof, where, when installed in a vehicle, the first battery monitor circuit is configured to communicate with the control circuit a first number of times per hour. In the storage mode, the first battery monitor circuit is configured to communicate with the control circuit a second number of times per hour, where the first number is at least ten times larger than the second number.

Aspect 36. The system of the fifteen preceding aspects or any combination thereof, where, in the storage mode, the control circuit is configured to communicate with a first number of battery monitor circuits. In the assembly mode, the control circuit is configured to communicate with a second number of battery monitor circuits, where the first number is at least two times larger than the second number.

Aspect 37. The system of the sixteen preceding aspects or any combination thereof, where, in the assembly mode, the control circuit is configured to test the plurality of battery monitor circuits until all of the battery monitor circuits have either passed testing or been replaced.

This disclosure has attributed functionality to the components shown in FIGS. 1-3. Control circuits 212 and 312, secondary communication circuit 260, processing circuitry 264, adjustment controller 266, microcontroller 320, and monitor circuits 387A-387H may include one or more processors. Control circuits 212 and 312, secondary communication circuit 260, processing circuitry 264, adjustment controller 266, microcontroller 320, and monitor circuits 387A-387H may include any combination of integrated circuitry, discrete logic circuitry, analog circuitry, such as one or more microprocessors, microcontrollers, DSPs, application specific integrated circuits (ASICs), central processing units (CPUs), graphics processing units (GPUs), FPGAs, and/or any other processing resources.

In some examples, control circuits 212 and 312, secondary communication circuit 260, processing circuitry 264, adjustment controller 266, microcontroller 320, and monitor circuits 387A-387H may include multiple components, such as any combination of the processing resources listed above, as well as other discrete or integrated logic circuitry, and/or analog circuitry.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM (PROM), erasable programmable ROM (EPROM), electronically erasable programmable ROM (EEPROM), flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

It is understood that the present disclosure provides a number of exemplary embodiments and that modifications are possible to these embodiments. Such modifications are expressly within the scope of this disclosure. Furthermore, application of these teachings to other environments, applications, and/or purposes is consistent with and contemplated by the present disclosure.

What is claimed is:

1. A system comprising:
    a plurality of battery monitor circuits including a first battery monitor circuit; and
    a control circuit configured to:
        in a production mode, test the plurality of battery monitor circuits;
        in a storage mode, test the plurality of battery monitor circuits more than once after testing the plurality of battery monitor circuits in the production mode; and
        in an assembly mode, test the plurality of battery monitor circuits after testing the plurality of battery monitor circuits in the storage mode.

2. The system of claim 1, wherein the control circuit is further configured to test the plurality of battery monitor circuits in the assembly mode after testing the plurality of battery monitor circuits in the production mode by skipping the storage mode.

3. The system of claim 1,
    wherein in the production mode, the control circuit is configured to encrypt, using a preconfigured network identification value, communications to the first battery monitor circuit, and
    wherein in the storage and assembly modes, the control circuit is configured to:
        negotiate a network key with the first battery monitor circuit; and
        encrypt, using the network key, communications to the first battery monitor circuit.

4. The system of claim 3,
    wherein the control circuit includes a first memory,
    wherein the first battery monitor circuit includes a second memory, and
    wherein the preconfigured network identification value is pre-loaded in the first and second memories.

5. The system of claim 3,
    wherein the control circuit is configured to determine the preconfigured network identification value without negotiating with the first battery monitor circuit, and
    wherein the first battery monitor circuit is configured to determine the preconfigured network identification value without negotiating with the control circuit.

6. The system of claim 3,
    wherein the control circuit is configured to negotiate the network key by at least:
        sending a first certificate to the first battery monitor circuit;
        verifying a second certificate received from the first battery monitor circuit; and
        computing the network key based on the first and second certificates, and
    wherein the first battery monitor circuit is configured to negotiate the network key by at least:
        verifying the first certificate received from the control circuit;
        sending the second certificate to the control circuit; and
        computing the network key based on the first and second certificates.

7. The system of claim 1, wherein in the production mode, the control circuit is configured to:
    perform a single round of testing on the first battery monitor circuit; and
    responsive to determining that the first battery monitor circuit has passed the single round of testing, refrain from performing additional testing on the first battery monitor circuit until the control circuit is operating in the storage mode.

8. The system of claim 7, wherein to perform the single round of testing, the control circuit is configured to:
    request a first data value from the first battery monitor circuit;
    determine that the first data value received from the first battery monitor circuit is acceptable;
    after determining that the first data value is acceptable, request a second data value from the first battery monitor circuit; and
    determine that the second data value received from the first battery monitor circuit is acceptable.

9. The system of claim 1,
    wherein the plurality of battery monitor circuits includes a second battery monitor circuit, and
    wherein in the production mode, the control circuit is configured to:
        broadcast network information at a first time;
        after broadcasting the network information at the first time, perform a first round of testing on the first battery monitor circuit;
        after finishing the first round of testing on the first battery monitor circuit, broadcast the network information at a second time;
        after broadcasting the network information at the second time, perform a second round of testing on the second battery monitor circuit;
        after finishing the second round of testing on the second battery monitor circuit, broadcast the network information at a third time; and
        in response to determining that a request to join a network has not been received after broadcasting the network information at the third time, exit the production mode.

10. The system of claim 1,
    wherein, when installed in a vehicle, the first battery monitor circuit is configured to communicate with the control circuit a first number of times per hour,
    wherein in the storage mode, the first battery monitor circuit is configured to communicate with the control circuit a second number of times per hour, and
    wherein the first number is at least ten times larger than the second number.

11. The system of claim 1,
    wherein in the storage mode, the control circuit is configured to communicate with a first number of battery monitor circuits of the plurality of battery monitor circuits, wherein in the assembly mode, the control circuit is configured to communicate with a second number of battery monitor circuits of the plurality of battery monitor circuits, and wherein the first number is at least two times larger than the second number.

12. The system of claim 1, wherein in the assembly mode, the control circuit is configured to test the plurality of battery monitor circuits until all of the battery monitor circuits have either passed testing or been replaced.

13. A method comprising:
by a control circuit operating in a production mode, testing a plurality of battery monitor circuits including a first battery monitor circuit;
by the control circuit operating in a storage mode, testing the plurality of battery monitor circuits more than once after testing the plurality of battery monitor circuits in the production mode; and
by the control circuit operating in an assembly mode, testing the plurality of battery monitor circuits after testing the plurality of battery monitor circuits in the storage mode.

14. The method of claim 13, further comprising:
in the production mode, encrypting communications to the first battery monitor circuit using a preconfigured network identification value;
in the storage and assembly modes, negotiating a network key with the first battery monitor circuit; and
in the storage and assembly modes, encrypting communications to the first battery monitor circuit using the network key.

15. The method of claim 14, wherein negotiating the network key comprises:
sending a first certificate to the first battery monitor circuit;
verifying a second certificate received from the first battery monitor circuit; and
computing the network key based on the first and second certificates.

16. The method of claim 13, further comprising:
in the production mode, performing a single round of testing on the first battery monitor circuit; and
in the production mode, responsive to determining that the first battery monitor circuit has passed the single round of testing, refraining from performing additional testing on the first battery monitor circuit until the control circuit is operating in the storage mode.

17. The method of claim 13, further comprising:
in the storage mode, communicating with a first number of battery monitor circuits; and
in the assembly mode, communicating with a second number of battery monitor circuits,
wherein the first number is at least two times larger than the second number.

18. A non-transitory computer-readable medium having executable instructions stored thereon, configured to be executable by processing circuitry for causing the processing circuitry to:
in a production mode, test a plurality of battery monitor circuits including a first battery monitor circuit;
in a storage mode, test the plurality of battery monitor circuits more than once after testing the plurality of battery monitor circuits in the production mode; and
in an assembly mode, test the plurality of battery monitor circuits after testing the plurality of battery monitor circuits in the storage mode.

19. The non-transitory computer-readable medium of claim 18, wherein the instructions are configured to be executable by the processing circuitry for further causing the processing circuitry to:
in the production mode, encrypt communications to the first battery monitor circuit using a preconfigured network identification value;
in the storage and assembly modes, negotiate a network key with the first battery monitor circuit; and
in the storage and assembly modes, encrypt communications to the first battery monitor circuit using the network key.

20. The non-transitory computer-readable medium of claim 18, wherein the instructions are configured to be executable by the processing circuitry for further causing the processing circuitry to:
in the production mode, perform a single round of testing on the first battery monitor circuit; and
in the production mode, responsive to determining that the first battery monitor circuit has passed the single round of testing, refrain from performing additional testing on the first battery monitor circuit until the processing circuitry is operating in the storage mode.

* * * * *